US012606907B2

(12) United States Patent
Kustra et al.

(10) Patent No.: US 12,606,907 B2
(45) Date of Patent: Apr. 21, 2026

(54) METHOD AND APPARATUS WITH HIGH CONDUCTANCE COMPONENTS FOR CHAMBER CLEANING

(71) Applicant: Applied Materials, Inc., Santa Clara, CA (US)

(72) Inventors: Rick Kustra, San Jose, CA (US); Kaushik Comandoor Alayavalli, Sunnyvale, CA (US); Jay D. Pinson, II, San Jose, CA (US); Sathya Swaroop Ganta, Sunnyvale, CA (US); Anup Kumar Singh, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/660,442

(22) Filed: Apr. 25, 2022

(65) Prior Publication Data

US 2022/0349050 A1 Nov. 3, 2022

Related U.S. Application Data

(60) Provisional application No. 63/182,475, filed on Apr. 30, 2021.

(51) Int. Cl.
*C23C 16/44* (2006.01)

(52) U.S. Cl.
CPC .................................. *C23C 16/4405* (2013.01)

(58) Field of Classification Search
None
See application file for complete search history.

(56) References Cited

U.S. PATENT DOCUMENTS

| | | | | |
|---|---|---|---|---|
| 5,102,496 | A * | 4/1992 | Savas | C23C 16/4401 134/1 |
| 5,817,534 | A * | 10/1998 | Ye | H01L 21/67028 438/758 |
| 6,081,414 | A * | 6/2000 | Flanigan | H01J 37/32532 279/128 |
| 9,209,032 | B2 * | 12/2015 | Zhao | H01J 37/32532 |
| 2006/0172542 | A1 * | 8/2006 | Bera | H01J 37/32082 156/345.43 |
| 2008/0142481 | A1 * | 6/2008 | White | C23C 16/4401 156/345.43 |
| 2016/0053376 | A1 * | 2/2016 | Nam | C23C 16/5096 118/723 R |
| 2017/0069464 | A1 * | 3/2017 | Ye | H01J 37/32082 |
| 2017/0256435 | A1 * | 9/2017 | Joubert | H01J 37/32642 |
| 2018/0261431 | A1 * | 9/2018 | Hammond, IV .. | H01J 37/32183 |
| 2019/0027344 | A1 * | 1/2019 | Okunishi | H01L 21/67103 |
| 2019/0363003 | A1 * | 11/2019 | Sarode Vishwanath | H01L 21/68735 |
| 2019/0371575 | A1 * | 12/2019 | Uchida | H01L 21/68735 |
| 2020/0328063 | A1 * | 10/2020 | Bobek | H01J 37/32091 |
| 2020/0370177 | A1 | 11/2020 | Franklin et al. | |

(Continued)

*Primary Examiner* — Jeffrie R Lund
*Assistant Examiner* — Tiffany Z Nuckols
(74) *Attorney, Agent, or Firm* — Patterson + Sheridan, LLP

(57) ABSTRACT

Embodiments of the present disclosure generally relate a process chamber including a lid and a chamber body coupled to the lid. The chamber body and lid define a process volume and a coupling ring is disposed within the chamber body and below the lid. The coupling ring is coupled to ground or is coupled to a coupling RF power source. A substrate support is disposed and movable within the process volume.

17 Claims, 5 Drawing Sheets

(56)                    References Cited

U.S. PATENT DOCUMENTS

2021/0005500  A1*    1/2021   Venkatasubramanian ...................
                                          H01J 37/32715
2021/0384015  A1*   12/2021   Wang ........................ B08B 9/08
2022/0102141  A1*    3/2022   Singh ............... H01L 21/02274

* cited by examiner

METHOD AND APPARATUS WITH HIGH CONDUCTANCE COMPONENTS FOR CHAMBER CLEANING

CROSS-REFERENCE TO RELATED APPLICATIONS

This application claims priority to U.S. Patent Application Ser. No. 63/182,475, entitled "METHOD AND APPARATUS WITH ENHANCED CONDUCTANCE COMPONENTS FOR CHAMBER CLEANING," filed Apr. 30, 2021, and assigned to the assignee hereof, the contents of which is hereby incorporated by reference in its entirety.

BACKGROUND

Field

Embodiments of the present disclosure generally relate to apparatus and methods used in the manufacture of semiconductor devices. More particularly, embodiments of the present disclosure relate to a substrate processing chamber, and components thereof, for forming semiconductor devices.

Description of the Related Art

Integrated circuits have evolved into complex devices that can include millions of transistors, capacitors and resistors on a single chip. The evolution of chip designs continually involves faster circuitry and greater circuit density. The demands for faster circuits with greater circuit densities impose corresponding demands on the materials used to fabricate such integrated circuits. In particular, as the dimensions of integrated circuit components are reduced to the sub-micron scale, there is a trend to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer.

As the pattern dimensions are reduced, the thickness of the energy sensitive resist is correspondingly reduced in order to control pattern resolution. Such thin resist layers can be insufficient to mask underlying material layers during the pattern transfer process due to attack by the chemical etchant. An intermediate layer (e.g., silicon oxynitride, silicon carbide or carbon film), called a hardmask, is often used between the energy sensitive resist layer and the underlying material layers to facilitate pattern transfer because of greater resistance to the chemical etchant. Hardmask materials having both high etch selectivity and high deposition rates are often utilized. As critical dimensions (CD) decrease, current hardmask materials lack the desired etch selectivity relative to underlying materials (e.g., oxides and nitrides) and are often difficult to deposit. After deposition, it is a challenge to clean certain components disposed within the chamber. Thus, there is a need in the art to provide an apparatus for fabricating semiconductor devices that enable effective cleaning of chamber components such as a pedestal.

SUMMARY

Embodiments of the present disclosure generally relate to systems used in the manufacture of semiconductor devices. More particularly, embodiments of the present disclosure relate to a substrate processing chamber, and components thereof, for forming hardmasks for use in semiconductor devices and for cleaning chamber components within the process volume.

In one embodiment, a process chamber is provided including a lid and a chamber body coupled to the lid. The chamber body and lid define a process volume and a coupling ring is disposed within the chamber body and below the lid. The coupling ring is coupled to ground or is coupled to a coupling RF power source. A substrate support is disposed and movable within the process volume.

In another embodiment, a process chamber is provided including a lid and a chamber body having a chamber sidewall. The lid and chamber sidewall defines a process volume. A substrate support includes a cathode assembly disposed and movable within a process volume. The cathode assembly includes an edge ring and an insulator. An outer diameter of the edge ring is substantially equal to an outer diameter of the cathode assembly. The outer diameter of the edge ring and the chamber sidewall form a gap. The gap is about 400 mil to about 600 mil.

In another embodiment, a method of processing a substrate is provided including depositing a film on a substrate disposed in a process volume of a process chamber. The method further includes cleaning the process chamber including introducing a cleaning mixture to the process volume and energizing the cleaning mixture with an RF bias source The substrate support is raised to form a coupling gap between a coupling ring of the process chamber disposed above a substrate support.

BRIEF DESCRIPTION OF THE DRAWINGS

So that the manner in which the above recited features of the present disclosure can be understood in detail, a more particular description of the disclosure, briefly summarized above, can be had by reference to embodiments, some of which are illustrated in the appended drawings. It is to be noted, however, that the appended drawings illustrate only typical embodiments of this disclosure and are therefore not to be considered limiting of its scope, for the disclosure can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to a substrate processing chamber used in substrate processing in the manufacture of electronic devices. Substrate processing includes deposition processes, including low pressure processes, plasma processes, and thermal processes used to manufacture electronic devices on substrates.

Figure 1:
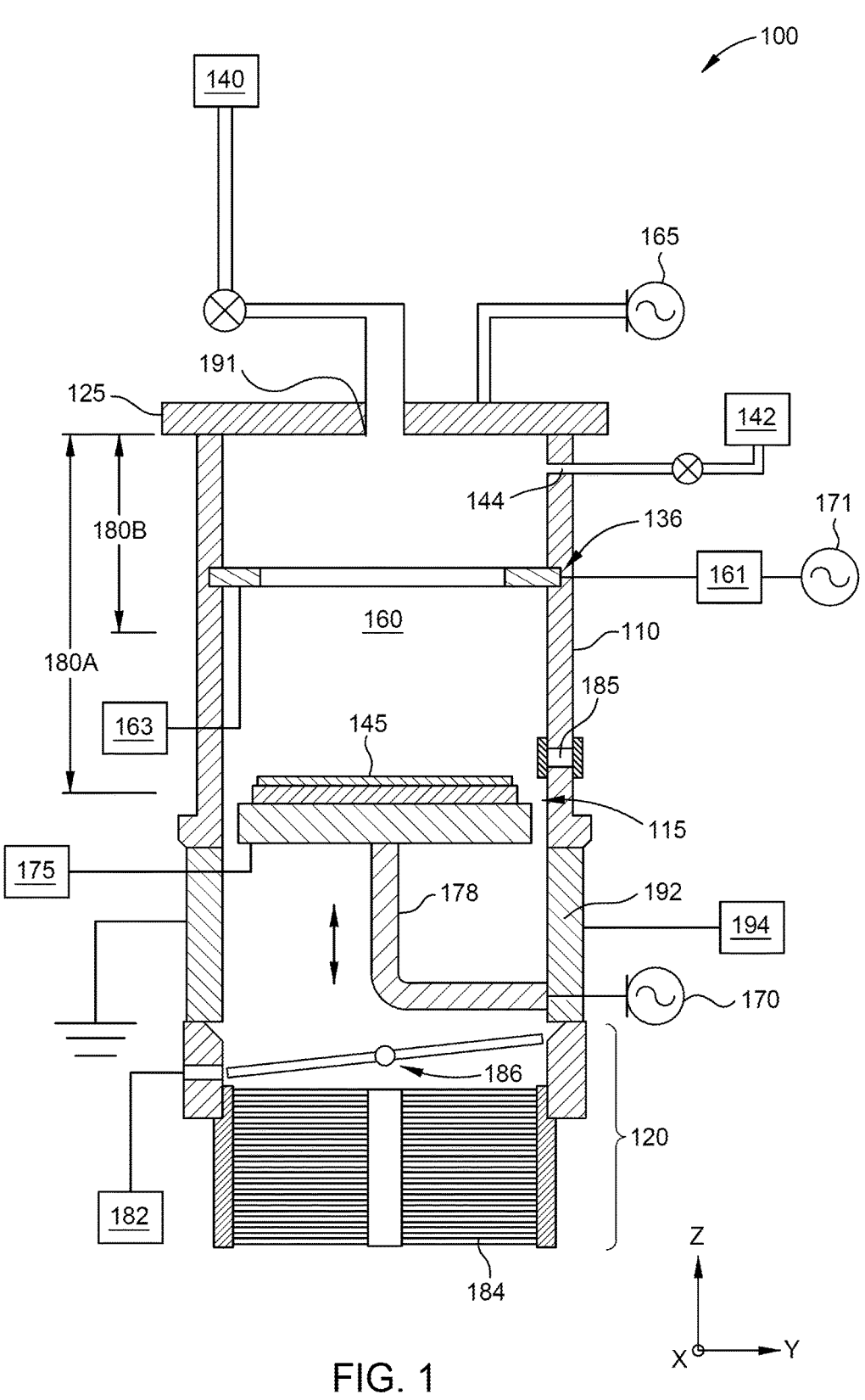
FIG. 1 is a schematic side cross sectional view of an illustrative processing chamber according to an embodiment.

FIG. 1 is a schematic side cross sectional view of an illustrative processing chamber 100 suitable for conducting a deposition process. In one embodiment, which can be combined with other embodiments described herein, the processing chamber 100 may be configured to deposit advanced patterning films onto a substrate, such as hardmask films, for example amorphous carbon hardmask films.

The processing chamber 100 includes a lid 125, a spacer 110 disposed on a chamber body 192, a substrate support 115, and a variable pressure system 120. The process chamber 100 includes an annular coupling ring 136 which is disposed below the lid 125 and over the substrate support 115. In some embodiments, which can be combined with other embodiments described herein, the coupling ring 136 is composed of metal such as aluminum.

The lid 125 is coupled to a first processing gas source 140. The first processing gas source 140 contains precursor gases for forming films on a substrate 145 supported on the substrate support 115. As an example, the first processing gas source 140 includes precursor gases such as carbon containing gases, hydrogen containing gases, and helium, among others. In a specific example, the carbon containing gas includes acetylene ($C_2H_2$). The first processing gas source 140 provides precursors gases through one or more channels 191 within the lid 125. The one or more channels 191 direct precursor gases from the first processing gas source 140 into a processing volume 160. In some embodiments, which can be combined with other embodiments described herein, a second processing gas source 142 is fluidly coupled to the processing volume 160 via an inlet 144 disposed through a gas ring with nozzles attached to the spacer 110, or through a chamber side wall. As an example, the second processing gas source 142 includes precursor gases such as carbon containing gases, hydrogen containing gases, and helium, among others, for example $C_2H_2$. In some embodiments, which can be combined with other embodiments described herein, a total flow rate of precursor gases into the processing volume 160 is about 100 sccm to about 2 slm. The flow of precursor gases in the processing volume 160 via the second processing gas source 142 are uniformly distributed in the processing volume 160. In one example, a plurality of inlets 144 may be radially distributed about the spacer 110 or about the chamber sidewall. In such an example, gas flow to each of the inlets 144 may be separately controlled to further facilitate gas uniformity within the processing volume 160.

The lid 125 is coupled to a first or upper radio frequency (RF) power source 165. The first RF power source 165 facilitates maintenance or generation of plasma, such as a plasma generated from a cleaning gas. The cleaning gas is ionized into a plasma in situ via the first RF power source 165. The substrate support 115 is coupled to a second or lower RF power source 170. The first RF power source 165 may be a high frequency RF power source (for example, about 13.56 MHz to about 120 MHz) and the second RF power source 170 may be a low frequency RF power source (for example, about 2 MHz to about 13.56 MHz). It is to be noted that other frequencies are also contemplated. In some implementations, the second RF power source 170 is a mixed frequency RF power source, providing both high frequency and low frequency power. Utilization of a dual frequency RF power source, particularly for the second RF power source 170, improves film deposition. In one example, utilizing a second RF power source 170 provides dual frequency powers. A first frequency of about 2 MHz to about 13.56 MHz improves implantation of species into the deposited film, while a second frequency of about 13.56 MHz to about 120 MHz increases ionization and deposition rate of the film.

One or both of the first RF power source 165 and the second RF power source 170 are utilized in creating or maintaining a plasma in the processing volume 160. For example, the second RF power source 170 may be utilized during a deposition process and the first RF power source 165 may be utilized during a cleaning process. In some deposition processes, the first RF power source 165 is used in conjunction with the second RF power source 170. During a deposition or etch process, one or both of the first RF power source 165 and the second RF power source 170 provide a power of about 100 Watts (W) to about 20,000 W in the processing volume 160 to facilitate ionization of a precursor gas. In one embodiment, which can be combined with other embodiments described herein, at least one of the first RF power source 165 and the second RF power source 170 are pulsed. In another embodiment, which can be combined with other embodiments described herein, the precursor gas includes helium and $C_2H_2$. In one embodiment, which can be combined with other embodiments described herein, $C_2H_2$ is provided at a flow rate of about 10 sccm to about 1,000 sccm and He is provided at a flow rate of about 50 sccm to about 10,000 sccm.

The substrate support 115 is coupled to an actuator 175 (i.e., a lift actuator) that provides movement thereof in the Z direction. The substrate support 115 is also coupled to a facilities cable 178 that is flexible which allows vertical movement of the substrate support 115 while maintaining communication with the second RF power source 170 as well as other power and fluid connections. The spacer 110 is disposed on the chamber body 192. A height of the spacer 110 allows movement of the substrate support 115 vertically within the processing volume 160. The height of the spacer 110 is about 0.5 inches to about 20 inches. In one example, the substrate support 115 is movable from a first distance 180A to a second distance 180B relative to the lid 125. In one embodiment, the second distance 180B is about ⅔ of the first distance 180A. For example, the difference between the first distance 180A and the second distance is about 5 inches to about 6 inches. Thus, from the position shown in FIG. 1, the substrate support 115 is movable by about 5 inches to about 6 inches relative to a lower surface of the lid 125. In another example, the substrate support 115 is fixed at one of the first distance 180A and the second distance 180B. In contrast to conventional plasma enhanced chemical vapor deposition (PECVD) processes, the spacer 110 greatly increases the distance between (and thus the volume between) the substrate support 115 and the lid 125. The increased distance between the substrate support 115 and the lid 125 reduces collisions of ionized species in the processing volume 160, resulting in deposition of film with less neutral stress.

The variable pressure system 120 includes a first pump 182 and a second pump 184. The first pump 182 is a roughing pump that may be utilized during a cleaning process and/or substrate transfer process. A roughing pump is generally configured for moving higher volumetric flow rates and/or operating a relatively higher (though still subatmospheric) pressure. In one example, the first pump 182 maintains a pressure within the processing chamber less than 50 mtorr during a cleaning process. In another example, the first pump 182 maintains a pressure within the processing chamber of about 0.5 mTorr to about 10 Torr. A valve 186 is used to control the conductance path to one or both of the first pump 182 and the second pump 184. The valve 186 also provides symmetrical pumping from the processing volume 160. Utilization of a roughing pump during cleaning operations facilitates relatively higher pressures and/or volumetric flow of cleaning gas (as compared to a deposition operation). The relatively higher pressure and/or volumetric flow during the cleaning operation improves cleaning of chamber surfaces.

The second pump 184 may be one a turbo pump and a cryogenic pump. The second pump 184 is utilized during a deposition process. The second pump 184 is generally configured to operate a relatively lower volumetric flow rate and/or pressure. For example, the second pump 184 is configured to maintain the processing volume 160 of the process chamber at a pressure of less than about 50 mtorr. In another example, the second pump 184 maintains a pressure within the processing chamber of about 0.5 mtorr to about 10 Torr. The process chamber 100 is configured to use both relatively lower pressure to improve deposition and relatively higher pressure to improve cleaning.

The processing chamber 100 includes a substrate transfer port 185 for placing and removing the substrate 145 from the substrate support 115. A controller 194 coupled to the processing chamber 100 is configured to control aspects of the processing chamber 100 during processing.

Figure 2A:
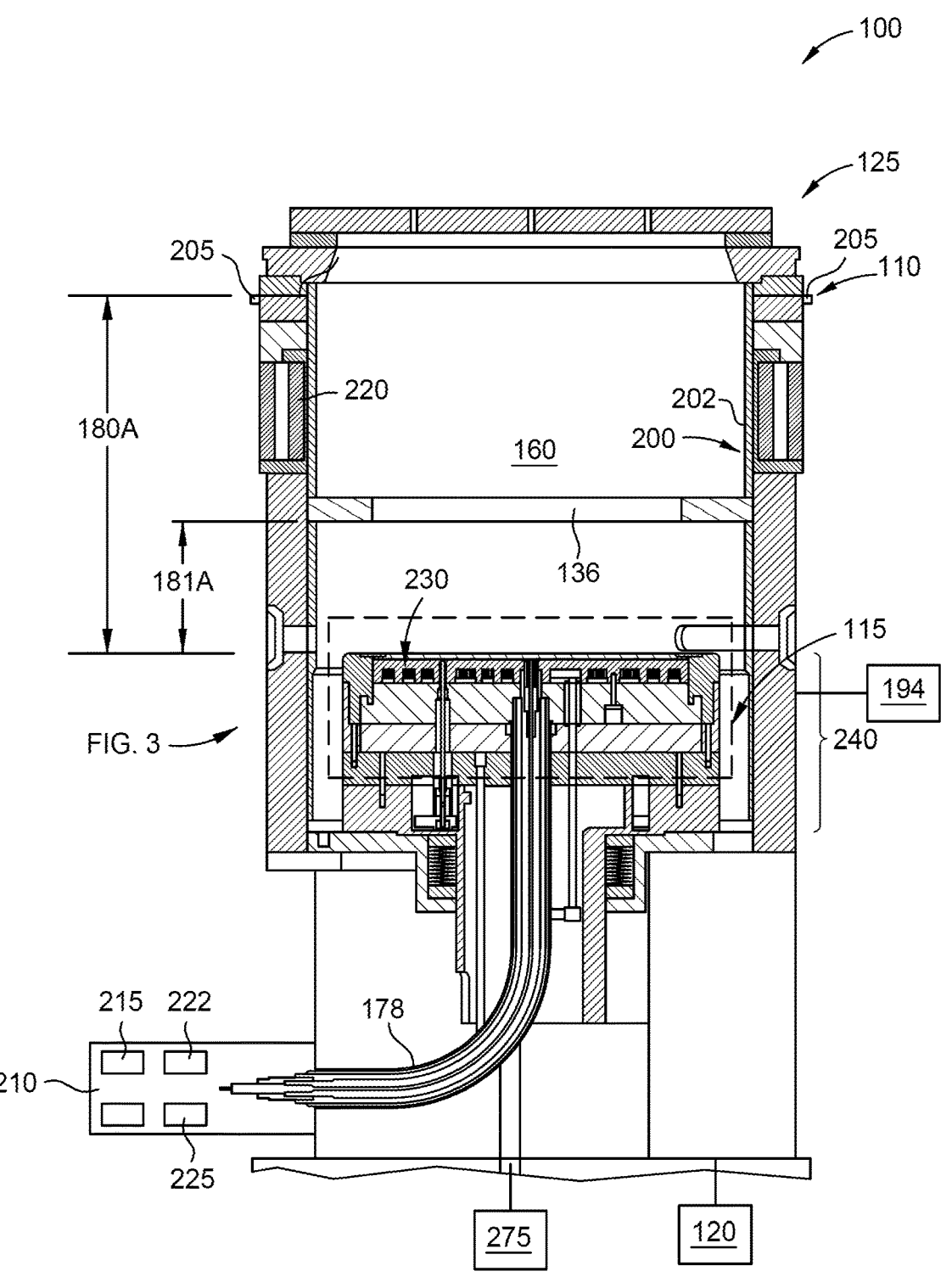
FIGS. 2A and 2B are schematic sectional views of the processing chamber according to an embodiment.
Figure 2B:
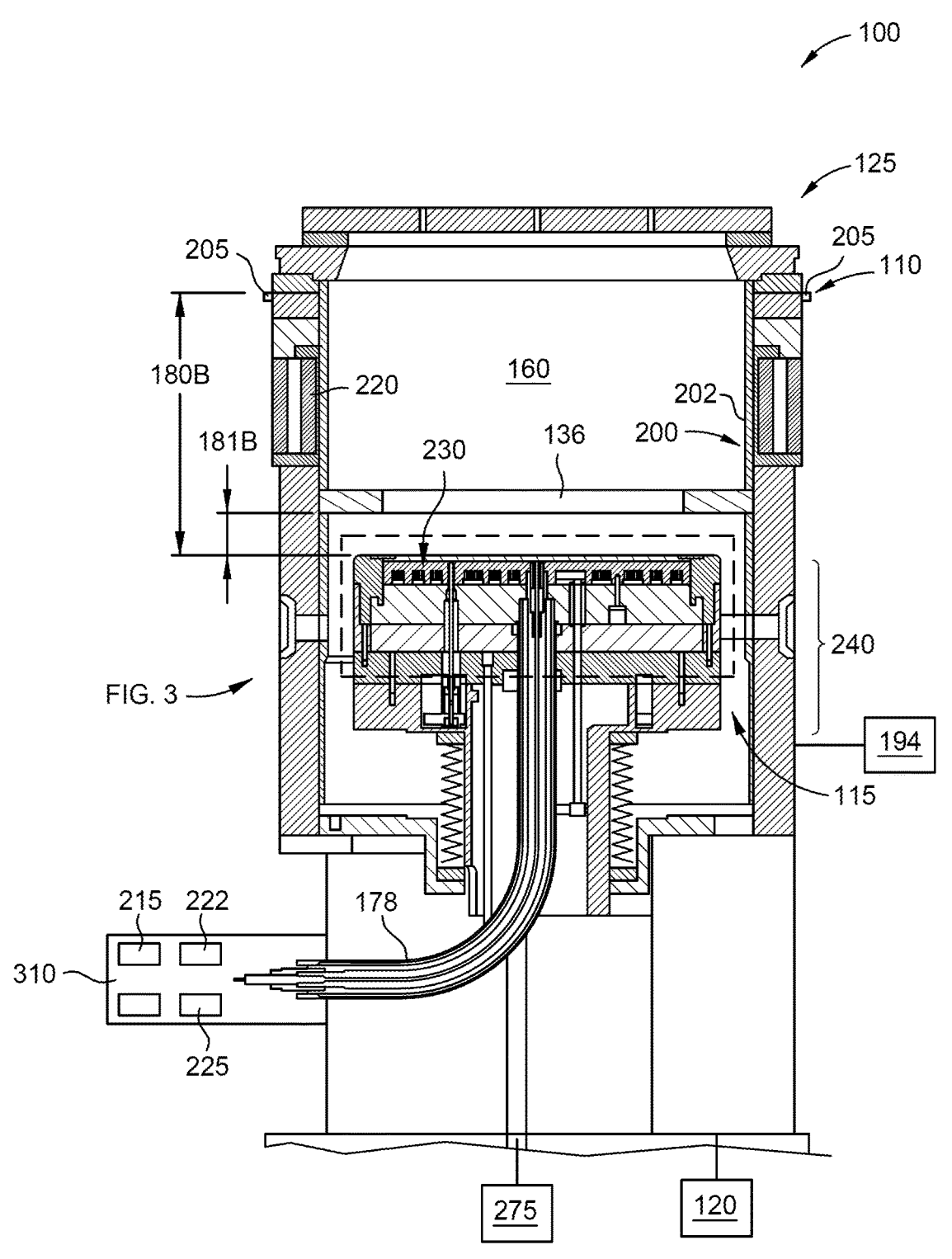

After processing a number of substrates, film accumulates within the chamber sidewalls and on chamber components, such as the substrate support 115. Because of the large distance between the lid 125 and the substrate support 115, certain portions of the interior chamber, such as above the peripheral portions of the substrate support 115, are difficult to clean. It has been discovered that a plasma density of the cleaning plasma in these portions is increased by positioning the coupling ring 136 between the substrate support 115 and the lid 125. In operation, an RF energy path propagates from the lower RF power source 170 through the sidewalls and to the coupling ring 136. In some embodiments, which can be combined with other embodiments described herein, the coupling ring 136 is part of a matching network 161 and a capacitance or impedance of the coupling ring 136 is tunable through the matching network 161 in order to control a plasma density above or below the coupling ring 136. In some embodiments, which can be combined with other embodiments described herein, the coupling ring 136 is powered by a coupling ring power source 171, such as an RF power source. The powered coupling ring 136 comprises hallow cathodes. During cleaning, the substrate support 115 is raised to reduce a gap between the substrate support 115 and the coupling ring 136. The gap is controllable to produce a predetermined plasma density depending on the process conditions of the process volume. FIG. 2A shows the cathode assembly 240 in a lowermost position (e.g., a first gap 181A) relative to the coupling ring 136 and FIG. 2B shows the cathode assembly 240 in a uppermost position (e.g., a second gap 181B) relative to the coupling ring 136. In some embodiments, which can be combined with other embodiments described herein, the coupling ring 136 is movable between and vertical position, such as during deposition, and a horizontal position, such as during cleaning. The coupling ring 136 is movable using an actuator 163.

FIGS. 2A and 2B are schematic sectional views of the processing chamber 100. The spacer 110 includes a liner 200 that surrounds the processing volume 160. The spacer 110 also includes a plurality of heater elements 205 embedded in or in thermal communication with the body of the spacer 110. The liner 200 is includes an interior surface 202 to be exposed to the processing volume 160. In the embodiments described herein, the conductivity of the liner 200, controlled by at least one of the interior surface 202 to be exposed to the processing volume 160 and the thickness of the liner 200, changes the current flow (e.g., direct current (DC), RF current, and other suitable currents) provided to an electrostatic chuck 230 of the substrate support 115. Increasing the conductivity of the liner 200, provides a short and symmetrical path for RF energy of a plasma sheath generated in the processing volume 160 to propagate from the sidewalls to a ground. The path for RF energy to propagate from the sidewalls to the ground improves current flow and reduces the amount of current required by the electrostatic chuck 230 through increased efficiency. The reduction of the amount of current required by the electrostatic chuck 230 allows for the delivery of increased voltage (e.g., $V_{dc}$) to the electrostatic chuck 230 through increased efficiency. The increased voltage results in greater ionization of the plasma sheath for increased ion or radical bombardment of the substrate 145. Increased ion or radical bombardment of the substrate 145 reduces the stress of the film to be deposited or etched. The spacer 110 also includes a magnet assembly 220 controlled by controller 194. The magnet assembly 220 includes two or more electrically conductive wires, each of the conductive wires is powered by power sources and each of the conductive wires is disposed in a portion of the spacer 110. In operation, magnet assembly 220 aids in plasma confinement and/or tuning in the processing volume 160. In one embodiment, which can be combined with other embodiments described herein, the magnet assembly 220 also forms a resonance cavity within the processing volume 160 during a deposition process. The resonance cavity provides a magnetic flux that extends the plasma sheath vertically downward (Z direction) towards a substrate (not shown in FIGS. 2A and 2B). The strength of one of the magnets in the magnet assembly 220 and the core material of the conductive wire provides for compression on the plasma in the processing volume 160 and extends the sheath of the plasma radially outward to the spacer 110. Extending the sheath of the plasma to the spacer 110 (e.g., to the liner 200 of the spacer 110) provides the short and symmetrical path for RF energy to propagate from the sidewalls to a ground. In some embodiments, the path for RF energy propagates to the coupling ring 136 and then to ground.

A cathode assembly 240, which includes the substrate support 115, is also shown in FIGS. 2A and 2B. The cathode assembly 240 is coupled to an actuator 275 (similar to actuator 175 shown in FIG. 1) that moves the cathode assembly 240 vertically in the Z direction. FIG. 2A shows the cathode assembly 240 in the lowermost position (e.g., the first distance 180A) relative to the lid 125 and FIG. 2B shows the cathode assembly 240 in the uppermost position (e.g., the second distance 180B) relative to the lid 125. The ability to adjust the position of the cathode assembly 240 for deposition processes, such as into a lowered position, allows an optimum film quality to be achieved. Additionally, the ability to position the cathode assembly 240 at a raised position and proximate to the coupling ring 136 enables enhanced cleaning of the substrate support 115. The diameter of the cathode assembly 240 is about 300 mm to about 400 mm, such as about 310 mm to about 360 mm, such as about 320 mm to about 340 mm. The cathode assembly 240 also includes a facilities interface 210. The facilities interface 210 provides connections for RF power as well as other electrical and fluid connections. The facilities interface 210 is coupled to the substrate support 115 via the facilities cable 178. Other connections include a power source 215, a coolant source 222 and a gas supply 225.

Figure 3:
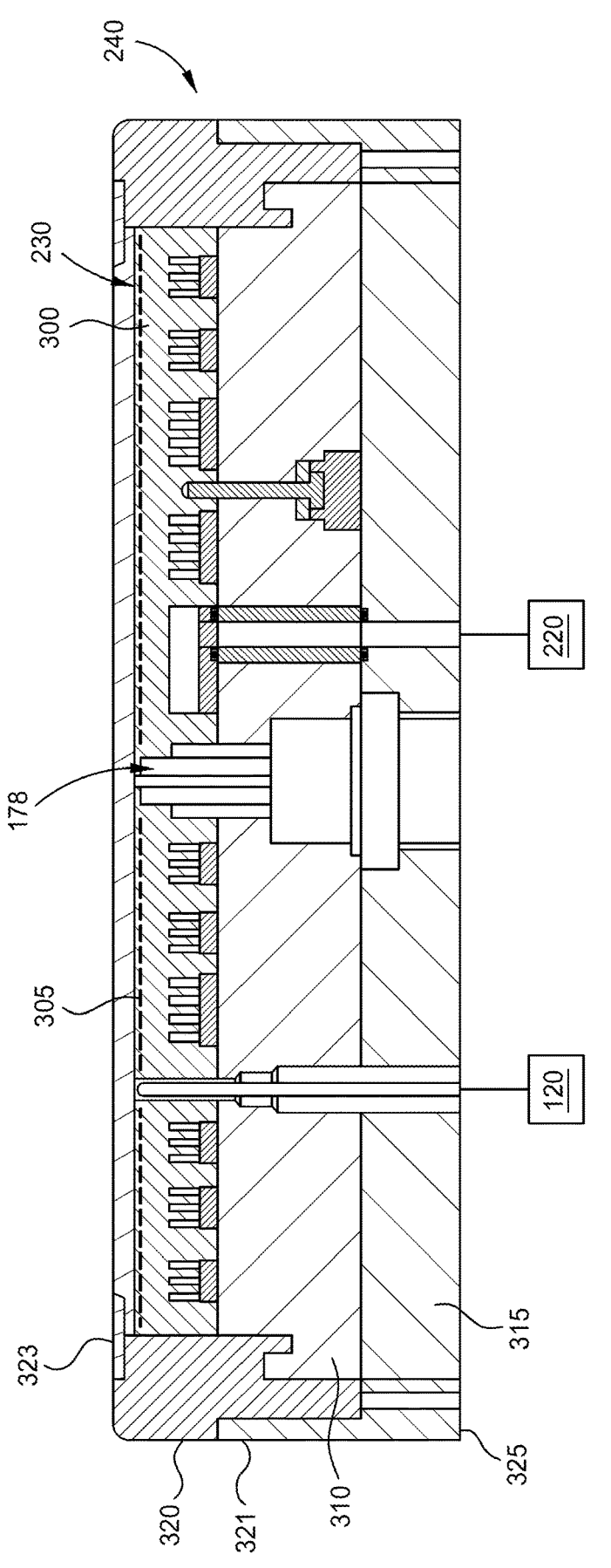
FIG. 3 is a schematic sectional view the substrate support according to an embodiment.

FIG. 3 is a schematic sectional view of one embodiment of the substrate support 115. The substrate support 115 includes an electrostatic chuck 230. The electrostatic chuck 230 includes a puck 300. The puck 300 includes one or more electrodes 305 embedded therein (a first electrode 305A and a second electrode 305B is shown in FIG. 3B). The first electrode 305A is utilized as a chucking electrode and the second electrode 305B is utilized as an RF biasing electrode. The substrate support 115 may be biased by providing RF power at a frequency of about 300 kHz to about 60 MHz to the second electrode 305B. The frequency provided to the second electrode 305B may be pulsed. The puck 300 is formed from a dielectric material, such as a ceramic material, for example aluminum nitride (AlN). During substrate processing, in order to have good film quality on the substrate, plasma density uniformity is controlled in the region of the substrate support 115 in which the substrate is disposed. The process conditions that are conducive to good film quality of on the substrate results in film deposition on other chamber components, such as the outer portion of the cathode assembly 240. It has been discovered that reducing the diameter of the cathode assembly 240, as provided herein, enables adequate plasma density uniformity for good film quality deposition on the substrate, such as high film density, and simultaneously reduces the amount of additional film deposited on chamber components that are difficult to clean. Conventional process chambers with smaller volumes and/or small heights between the lid and the substrate support typically use cathode assemblies having diameters substantially larger than the substrate that is being processed in order to deposit good quality film. It has been discovered that the large processing volume 160, as described herein, enables the deposition of good quality film on the substrate disposed on a cathode assembly 240. The cathode assembly 240 includes an edge ring 323 and an insulator ring 320.

The puck 300 is supported by a dielectric plate 310 and a base plate 315. The dielectric plate 310 may be formed from an electrically insulative material, such as quartz, or a thermoplastic material, such as high performance plastics sold under the tradename REXOLITE®. The base plate 315 may be made from a metallic material, such as aluminum. During operation, the base plate 315 is coupled to ground or is electrically floating while the puck 300 is RF hot. At least the puck 300 and the dielectric plate 310 are surrounded by an insulator ring 320. The insulator ring 320 may be made of a dielectric material such as quartz, silicon, or a ceramic material. In some embodiments, which can be combined with other embodiments described herein, the insulator ring 320 is composed of aluminum oxide. The base plate 315 and a portion of the insulator ring 320 is surrounded by a ground ring 325 made of aluminum. The insulator ring 320 prevents or minimizes arcing between the puck 300 and the base plate 315 during operation. An end of the facilities cable 178 is shown in openings formed in the puck 300, the dielectric plate 310 and the base plate 315. Power for the electrodes of the puck 300, as well as fluids from the gas supply 225 (shown in FIGS. 2A and 2B) to the substrate support 115, is provided by the facilities cable 178.

The edge ring 323 comprises a dielectric material, such as quartz, silicon, cross-linked polystyrene and divinylbenzene (e.g., REXOLITE®), PEEK, $Al_2O_3$, aluminum nitride (AlN), among others. Using an edge ring 323 comprising such a dielectric material helps modulate the plasma coupling, modulating the plasma properties, such as the voltage on the substrate support ($V_{dc}$), without having to change the plasma power, thus improving the properties of the hard-mask films deposited on substrates. In some embodiments, which can be combined with other embodiments described herein, the edge ring 323 is composed of aluminum nitride. The composition of the edge ring 323 influences the electric field in a peripheral region between the edge ring 323 and the coupling ring 136. It has been found that aluminum nitride is a material that is conducive to provide a high electric field and is resistive to processing and cleaning chemistries. The electric field ignites the plasma and enhances a plasma density in the peripheral region. In some embodiments, the insulator ring 320 is composed of quartz. In conventional chambers having large processing volumes, the plasma density radially outward form the substrate edge is relatively low and cleaning efficiency is reduced in regions such as above and at the outer diameter of the substrate support 115. In some embodiments, an actuator is coupled to the edge ring 323 to tilt or lift during cleaning to improve cleaning efficiency in the outer edge areas. Plasma density is increased at an outer portion of the substrate support 115 to provide power for heating the edge ring 323. Increasing plasma density at the outer portion of the substrate support 115 is further increased by using the coupling ring 136 and cathode assembly 240 described herein. A top surface of the edge ring 323 is substantially coplanar with a top surface of the insulator ring 320. Alternatively, a top surface of the edge ring 323 is lower than a top surface of the insulator ring 320.

With reference to FIGS. 2A and 2B, the edge ring 323 is disposed below the annular coupling ring 136, such that coupling ring 136 and the edge ring 323 is substantially aligned in the radial direction. Without being bound by theory, it is believed that placement of the coupling ring 136 in the process volume enables effective cleaning by increasing the plasma density between the coupling ring 136 and the edge ring 323. Thus, the outer areas of the substrate support 115 are cleaned without greatly increasing bias power and/or substantially reducing cleaning pressures. Conventional process chambers having large process volumes use high bias powers such as about 1500 W to about 2000 W and low pressures such as about 10 mTorr and about 50 mTorr during cleaning in order to increase bombardment radially outward on the substrate support 115. It has been observed that plasma density typically drops quickly radially outward from a center of the substrate support 115. An increase in plasma density enhances the cleaning efficiency at an outer edge 321 of the substrate support 115, however, a corresponding increase of plasma density at the center of the substrate support 115 tends to increase bombardment and damage the substrate support 115, and thus cause substrate defects. The edge ring 323 and coupling ring 136 described herein enables high plasma density in the outer portion of the substrate support 115 without greatly increasing plasma density at the center portion of the substrate support 115. Unlike conventional edge rings, the edge ring 323 described herein extends all the way to the outer edge of the substrate support 115. Without being bound by theory, it is believed that the coupling ring 136 skews the plasma sheath by moving the coupling of the substrate support 115 from the chamber liner 200 to the coupling ring 136. High plasma density is observed when RF coupling shifts from the liner 200 to the coupling ring 136. In some embodiments, which can be combined with other embodiments described herein, a gap between the edge ring 323 and the coupling ring 136 is about 300 mils to about 700 mils, such as about 500 mils.

In some embodiments, which can be combined with other embodiments described herein, the coupling ring 136 is solid from an inner diameter of the coupling ring 136 to an outer diameter of the coupling ring 136. In some embodiments, which can be combined with other embodiments described herein, the coupling ring 136 is a powered coupling ring 136 (e.g., powered by coupling ring power source 171) and includes perforations, such as holes or slots to create a hollow-cathode effect. The powered coupling ring 136, enhances cleaning efficiency below a lower surface of the coupling ring 136. Alternatively, the coupling ring 136 is a grounded coupling ring 136 and includes perforations, such as holes or slots to improve cleaning efficiency on an upper surface of the coupling ring 136. The coupling ring 136 is disposed at a height along the process chamber 100 based on a location of the process chamber 100 where increased plasma density is desired. In operation, the substrate support 115 is raised to a position to form a gap between the substrate support 115 and the coupling ring 136 based on the operating conditions of the process volume 160 and the type and quality of the film on the chamber components to be cleaned. In some embodiments, which can be combined with other embodiments described herein, the outer diameter of the coupling ring 136 is substantially the same as the inner diameter of the chamber liner 200, such within about 5% smaller than the inner diameter of the chamber liner 200. The inner diameter is substantially equal to a diameter of the substrate, such as within +/− about 5% of the diameter of the substrate. The inner and outer diameter of the coupling ring 136 is determined to provide an electric field that is used to ignite and sustain plasma at certain portions of the process chamber. Although the figures depict a grounded coupling ring 136, powered coupling rings 136 are also contemplated, as described herein.

Figure 4:
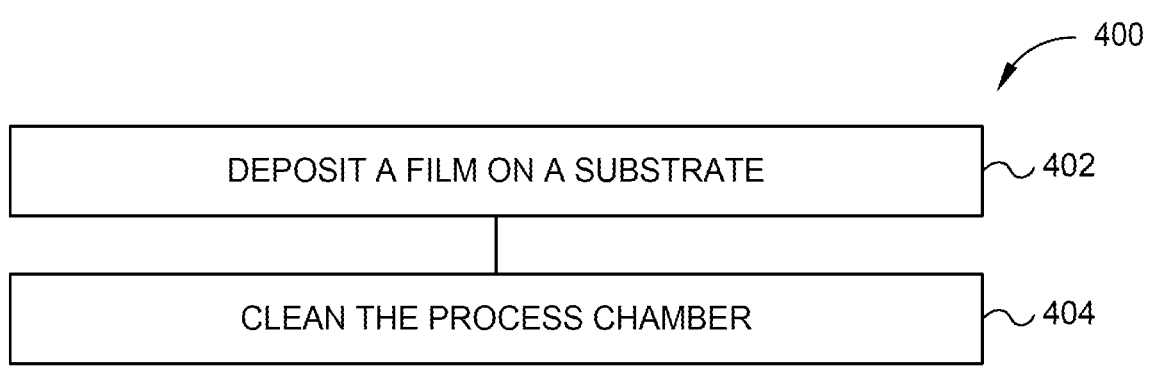
FIG. 4 is a flow diagram of a method of process a substrate according to an embodiment.

FIG. 4 depicts a flow diagram of a method 400 of processing a substrate. The method includes, in operation 402, depositing a film on a substrate. The substrate is processed in a process chamber. The process chamber includes a lid and a coupling ring 136 disposed below the lid. The coupling ring 136 is coupled to ground (e.g., FIGS. 2A, 2B) or is coupled to a coupling ring RF power source (e.g., FIG. 1). A chamber body coupled to the lid, and the chamber body and lid define a process volume. A substrate support is disposed and movable within the process volume. During deposition, the substrate is in a lowered positioned relative to the coupling ring 136. Depositing the film on the substrate includes introducing a gas mixture including a helium-containing gas and a carbon-containing gas to a process volume of a process chamber. The carbon-containing gas is an alkyne such as acetylene. The gas mixture is energized with a radiofrequency (RF) source comprising about 4 KW of power at a frequency of about 13 MHz. Depositing the film includes maintaining a volume pressure about 1500 W or greater.

In operation 404, the process chamber is cleaned. Cleaning the processing chamber includes removing the substrate from the process volume 160, and raising the substrate support 115 to a raised position relative to the coupling ring 136. In some embodiments, which can be combined with other embodiments described herein, the coupling ring 136 is movable to a horizontal position for cleaning. Cleaning the processing chamber includes an RF bias power to an RF biasing electrode (e.g., 305B of substrate support 115). A coupling gap is formed between the coupling ring 136 and an edge ring 323 of the substrate support 115. The coupling gap height is controllable by raising or lowering the substrate support 115 in order to increase a plasma density between an edge ring 323 of the substrate support 115 and the coupling ring 136. The coupling gap is between about 300 mil to about 1000 mil, such as about 350 mil to about 500 mil. The cleaning mixture includes an argon-containing gas and an oxygen containing gas, such as oxygen and/or ozone. In some embodiments, which can be combined with other embodiments described herein, the cleaning gas comprises fluorine-containing gases, such as $NF_3$. It has been discovered that increasing ion energy flux proximate to the substrate edge increases potential for increasing erosion of the edge ring 323. Moreover, it has further been discovered that increasing ion energy flux over the top surface of the insulator, radially outward from the substrate edge increases cleaning of film over the surface of the insulator top surface. The top surface of the edge ring 323 is coplanar with a top surface of the insulator ring 320.

Depending on the cleaning condition (e.g., operating parameters) a height between the coupling ring and insulating ring and an inner diameter of the coupling ring is optimized to increase an ion energy flux over the surface of the insulating ring while minimizing an ion energy flux proximate to the substrate edge. In some embodiments, in a cleaning condition, an ion energy flux proximate to the substrate edge processed in a process chamber with a coupling ring is less than 7 times, such as about 1.2 times to about 5 times, such as about 2 times to about 3 times larger than an ion energy flux proximate to the substrate edge which is processed in a process chamber without a coupling ring.

In some embodiments, in a cleaning condition, an ion energy flux proximate to the insulator ring surface processed in a process chamber with a coupling ring is about 2 times to about 10 times, such as about 2 times to about 6 times, such as about 3 times to about 4 times larger than an ion energy flux proximate to the insulator ring surface which is processed in a process chamber without a coupling ring.

In some embodiments, a cleaning condition includes oxygen and argon based plasma flow rates, and process pressure. In some embodiments, which can be combined with other embodiments described herein, an etch rate at a pressure of 800 mTorr is about 2 times to about 5 times the etch rate of a pressure of about 1600 mTorr.

Figure 5:
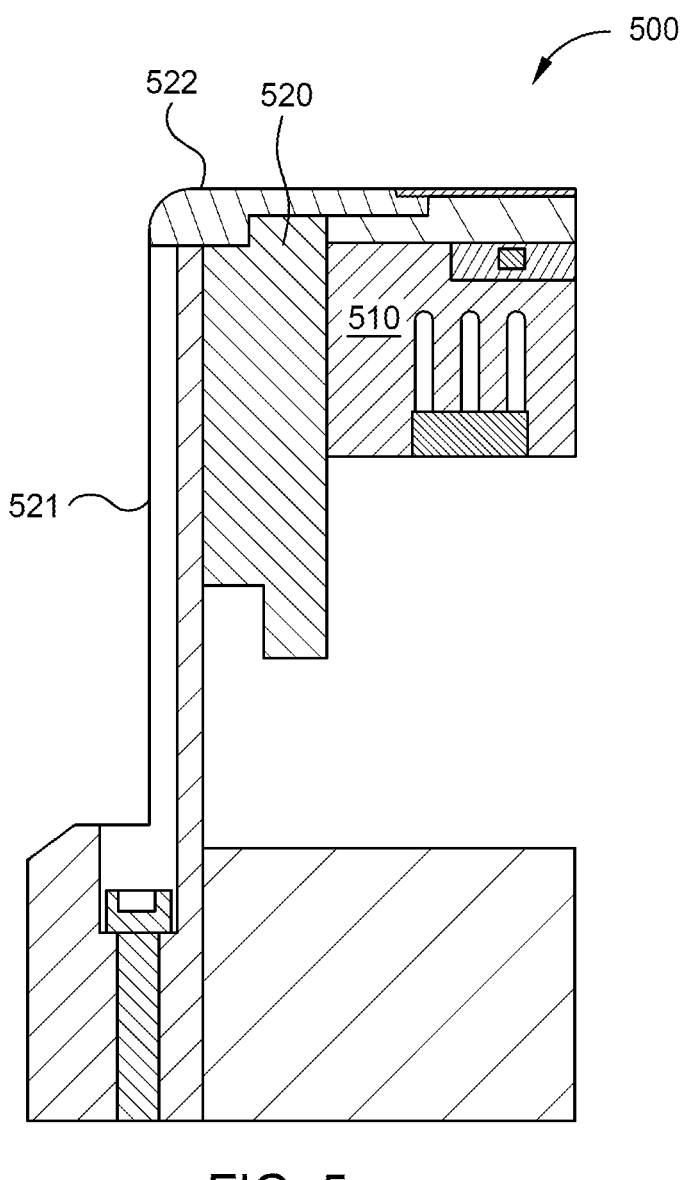
FIG. 5 is a schematic sectional view of the substrate support according to an embodiment.

FIG. 5 includes a reduced diameter cathode assembly 500. Cathode assembly 500 is similar to the cathode assembly 240 depicted in FIGS. 2A, 2B, and 3, except that it has a reduced diameter relative to cathode assembly 240. The reduced diameter cathode assembly 500 includes an insulator ring 520, a puck 510, a grounding ring 521, and an edge ring 522. The cathode assembly 500 diameter reduces the amount of film deposited in areas of the cathode assembly 500 radially outward of the substrate, such as on the edge ring 522. Additionally, the cathode assembly 500 provides increased volume between the cathode assembly 500 and the chamber sidewall that is used to ignite and sustain cleaning plasma during cleaning processes. The additional volume enables enhanced cleaning of the outside portion of the cathode assembly 500. The cathode assembly 500 can be used in combination with the coupling ring 136 as described in FIGS. 1, 2A, and 2B.

The edge ring 522 is disposed over the top surface of the insulator ring 520. The edge ring 522 surrounds at least a portion of the outer edge of the insulator ring 520. A vacuum gap is formed between the edge ring 522 and the insulator ring 520. The vacuum gap provides a thermal barrier between the edge ring 522 and the insulator ring 520. A conductive heat path is formed through the substrate support 115 to the edge ring 522. The edge ring 522 described herein is capable of heating up quickly and maintaining heat to maintain fast etch rates during cleaning. Conventional edge ring and insulator ring designs provide for a conductive heat path through the insulator ring 520. The insulator ring 520 described herein is substantially resistive to heat from the substrate support 115. In operation, the insulator ring 520 described herein cools the edge ring 522 convectively. An exposed surface at a top surface of the edge ring 522 is free of gaps, which mitigates trapping of residues, and facilitates easier cleaning.

While the foregoing is directed to embodiments of the present disclosure, other and further embodiments of the disclosure can be devised without departing from the basic scope thereof, and the scope thereof is determined by the claims that follow.

The invention claimed is:

1. A process chamber suitable for processing semiconductor substrates, comprising:
   a lid;
   a chamber body coupled to the lid, wherein the chamber body and lid define a process volume;
   a substrate support disposed and movable within the process volume, the substrate support comprising:
      an edge ring; and
      an insulator ring, the insulator ring defining an outer edge of the substrate support, the insulator ring separating the edge ring from the outer edge of the substrate support; and
   a coupling ring disposed within the chamber body and located between the lid and the substrate support, wherein the coupling ring is coupled to a radio frequency (RF) power source, wherein the coupling ring has a single central opening and an inner diameter extending into the process volume, and the coupling ring extends at least partially over a portion of the edge ring of the substrate support.

2. The process chamber of claim 1, wherein the coupling ring is coupled to the RF power source when the substrate support is in a raised position.

3. The process chamber of claim 1, wherein the edge ring is configured to move in a first position and a second position.

4. The process chamber of claim 3, wherein the inner diameter of the coupling ring is sized to extend inwardly of the insulator ring.

5. The process chamber of claim 1, wherein a coupling gap formed between a lower surface of the coupling ring and a top surface of the substrate support is about 300 mil to about 1000 mil when the substrate support is in a raised position.

6. The process chamber of claim 1, wherein the coupling ring comprises a plurality of apertures.

7. The process chamber of claim 1, wherein the coupling ring is coupled to a match configured to tune a capacitance of a tuning circuit.

8. The process chamber of claim 1, wherein the coupling ring is composed of aluminum.

9. The process chamber of claim 1, wherein a top surface of the edge ring is substantially coplanar with a top surface of the insulator ring.

10. The process chamber of claim 1, further comprising a controller configured to raise the substrate support to a raised position to increase a plasma density between the edge ring and the coupling ring, wherein a coupling gap between a lower surface of the coupling ring and a top surface of the substrate support is about 300 mil to about 1000 mil when the substrate support is in the raised position.

11. The process chamber of claim 1, wherein the substrate support further comprises:
   a puck supported at least partially by a dielectric plate, wherein the insulator ring surrounds the puck and the dielectric plate; and
   a ground ring surrounding a portion of the insulator ring.

12. A process chamber suitable for processing semiconductor substrates, comprising:
   a lid;
   a chamber body comprising a chamber sidewall, wherein the lid and chamber sidewall defines a process volume;
   a substrate support comprising cathode assembly disposed and movable within a process volume, the cathode assembly comprising an edge ring and an insulator, wherein an outer diameter of the edge ring is substantially equal to an outer diameter of the cathode assembly, wherein the outer diameter of the edge ring and the chamber sidewall form a gap, wherein the gap is about 400 mil to about 600 mil; and
   a coupling ring disposed within the chamber body and located between the lid and the substrate support, wherein the coupling ring is coupled to ground or is coupled to a radio frequency (RF) power source, wherein the coupling ring has a central opening and an inner diameter extending into the process volume such that the coupling ring overlaps the edge ring.

13. The process chamber of claim 12, wherein the edge ring is composed of aluminum nitride and the insulator is composed of quartz.

14. The process chamber of claim 9, wherein the edge ring is disposed over a top surface of the insulator.

15. The process chamber of claim 12, wherein a gap is formed between the edge ring and the insulator.

16. The process chamber of claim 12, wherein the substrate support further comprises a puck and a grounding ring, the insulator includes a ring surrounds the puck, and the grounding ring surrounds the insulator.

17. The process chamber of claim 12, further comprising a controller configured to raise the substrate support to a raised position to increase a plasma density between the edge ring and the coupling ring, wherein a coupling gap between a lower surface of the coupling ring and a top surface of the substrate support is about 300 mil to about 1000 mil when the substrate support is in the raised position.

\* \* \* \* \*